United States Patent
Cooney, III et al.

(10) Patent No.: US 8,052,799 B2
(45) Date of Patent: Nov. 8, 2011

(54) BY-PRODUCT COLLECTING PROCESSES FOR CLEANING PROCESSES

(75) Inventors: Edward Crandal Cooney, III, Jericho, VT (US); William Joseph Murphy, North Ferrisburgh, VT (US); Anthony Kendall Stamper, Williston, VT (US); David Craig Strippe, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 924 days.

(21) Appl. No.: 11/548,717

(22) Filed: Oct. 12, 2006

(65) Prior Publication Data

US 2008/0093212 A1    Apr. 24, 2008

(51) Int. Cl.
*C23F 1/00* (2006.01)
*H01L 21/02* (2006.01)
*B08B 17/02* (2006.01)

(52) U.S. Cl. . 134/1.2; 216/71; 156/345.33; 156/345.41; 156/345.48; 134/1.1; 134/30

(58) Field of Classification Search ............. 134/1.2, 134/30; 216/58, 71; 156/345.33, 345.41, 156/345.48, 345.51
See application file for complete search history.

(56) References Cited

U.S. PATENT DOCUMENTS

| | | | | |
|---|---|---|---|---|
| 3,617,459 A | * | 11/1971 | Logan | 204/192.23 |
| 4,357,203 A | | 11/1982 | Zelez | |
| 4,358,686 A | * | 11/1982 | Kinoshita | 250/492.2 |
| 4,985,372 A | | 1/1991 | Narita | |
| 5,006,192 A | * | 4/1991 | Deguchi | 156/345.44 |
| 5,660,682 A | | 8/1997 | Zhao et al. | |
| 6,071,372 A | * | 6/2000 | Ye et al. | 156/345.48 |
| 6,478,924 B1 | * | 11/2002 | Shamouilian et al. | 156/345.48 |
| 6,547,934 B2 | | 4/2003 | Cohen et al. | |
| 6,864,183 B2 | * | 3/2005 | Maekawa | 438/710 |
| 2004/0045577 A1 | * | 3/2004 | Ji et al. | 134/1.1 |
| 2005/0181588 A1 | | 8/2005 | Kim | |
| 2005/0189075 A1 | * | 9/2005 | Pan et al. | 156/345.52 |
| 2007/0051387 A1 | * | 3/2007 | Hwang et al. | 134/1.1 |
| 2007/0257372 A1 | | 11/2007 | Tada et al. | |

FOREIGN PATENT DOCUMENTS

WO    2005098913 A1    10/2005

\* cited by examiner

*Primary Examiner* — Michael Kornakov
*Assistant Examiner* — Natasha Campbell
(74) *Attorney, Agent, or Firm* — Schmeiser, Olsen & Watts; Anthony J. Canale

(57) ABSTRACT

An apparatus and a method for operating the same. The method includes providing an apparatus which includes a chamber, wherein the chamber includes first and second inlets, an anode and a cathode structures in the chamber, and a wafer on the cathode structure. A cleaning gas is injected into the chamber via the first inlet. A collecting gas is injected into the chamber via the second inlet. The cleaning gas when ionized has a property of etching a top surface of the wafer resulting in a by-product mixture in the chamber. The collecting gas has a property of preventing the by-product mixture from depositing back to the surface of the wafer.

16 Claims, 1 Drawing Sheet

BY-PRODUCT COLLECTING PROCESSES FOR CLEANING PROCESSES

FIELD OF THE INVENTION

The present invention relates to by-products of cleaning processes, and more specifically relates to processes for collecting the by-products resulting from cleaning processes.

BACKGROUND OF THE INVENTION

In a typical fabrication process for forming a transistor, before forming the two contacting regions to provide electrical paths to the two source/drain regions of the transistor, a cleaning process is performed to remove native oxide layers at bottom walls of the two contact holes. This cleaning process usually creates by-products that may contaminate the surface of the wafer. Therefore, there is a need for a collecting process to prevent these by-products from contaminating the wafer.

SUMMARY OF THE INVENTION

The present invention provides a device fabrication process. First, an apparatus is provided which includes (a) a chamber, wherein the chamber includes a first inlet and a second inlet, (b) an anode structure in the chamber, (c) a cathode structure in the chamber, wherein the cathode structure is more negatively charged than the anode structure, and (d) a wafer on the cathode structure. Then, a cleaning gas is injected into the chamber via the first inlet. Then, a collecting gas is injected into the chamber via the second inlet. The cleaning gas when ionized has a property of etching a top surface of the wafer resulting in a by-product mixture in the chamber. The collecting gas has a property of preventing the by-product mixture from depositing back to the surface of the wafer.

The present invention also provides a fabrication apparatus. The apparatus includes (a) a chamber; (b) an anode structure in the chamber; and (c) a cathode structure in the chamber. The cathode structure is more negatively charged than the anode structure. The apparatus further includes a wafer on the cathode structure; (e) a plasma region formed between the anode structure and the cathode structure; and (f) a cleaning gas in the chamber. The plasma region includes a plasma resulting from an ionization of the cleaning gas in the plasma region. The plasma region includes (g) a collecting gas in the chamber but not in the plasma region.

The present invention provides a collecting process that prevents the by-product contamination problem of the prior art.

DETAILED DESCRIPTION OF THE INVENTION

Figure 1:
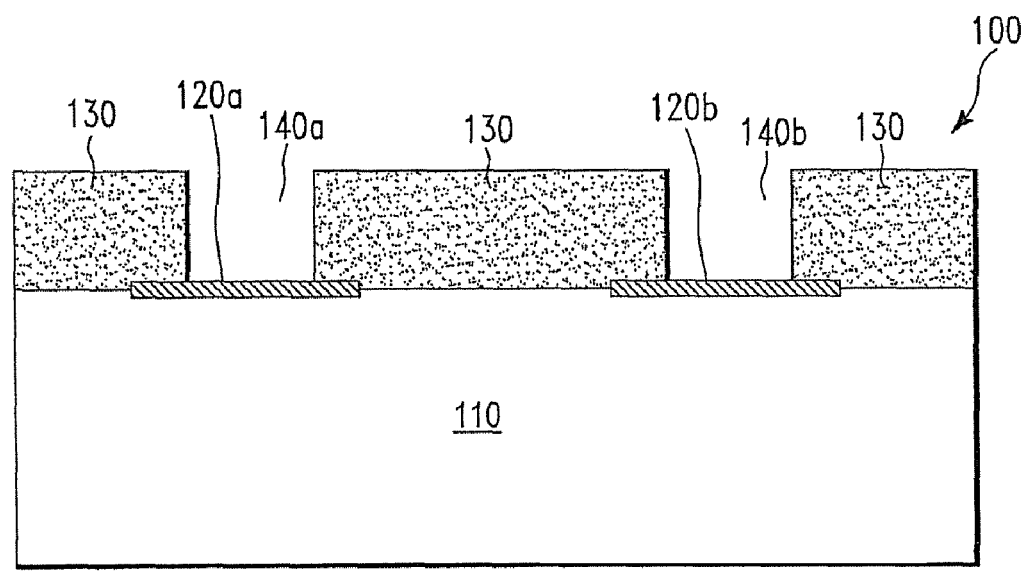
FIG. 1 illustrates a cross section view of a semiconductor structure, in accordance with embodiments of the present invention.

FIG. 1 illustrates a cross section view of a semiconductor structure 100, in accordance with embodiments of the present invention. More specifically, in one embodiment, the semiconductor structure 100 comprises a semiconductor (e.g., silicon, . . . ) substrate 110, a first silicide region 120a, a second silicide region 120b, a dielectric layer 130, a first contact hole 140a, and a second contact hole 140b.

In one embodiment, the dielectric layer 130 comprises silicon dioxide ($SiO_2$), silicon nitride ($Si_xN_y$), or a low-K carbon containing material. In one embodiment, the first contact hole 140a and the second contact hole 140b are formed by etching the dielectric layer 130 with RIE (reactive ion etching) until the first and second silicide regions 120a and 120b are exposed to the surrounding ambient.

Assume that two electrical contacting regions (not shown) are to be formed in the first and second contact holes 140a and 140b so as to provide electrical paths down to the first and second silicide regions 120a and 120b, respectively. As a result, it should be noted that, the surrounding ambient usually has oxygen, therefore, the first and second silicide regions 120a and 120b chemically react with the oxygen of the surrounding ambient to form native silicon oxide layers (not shown) on the bottom walls of the first and second contact holes 140a and 140b. It should be noted that, the resultant native silicon oxide layers prevent the subsequently formed electrical contacting regions (not shown) from making good electrical contacts with the silicide regions 120a and 120b, respectively. As a result, in one embodiment, a cleaning process is performed to remove the native silicon oxide layers before the electrical contacting regions are formed in the first and second contact holes 140a and 140b. In one embodiment, the cleaning process is performed in the chamber structure 200 (FIG. 2).

Figure 2:
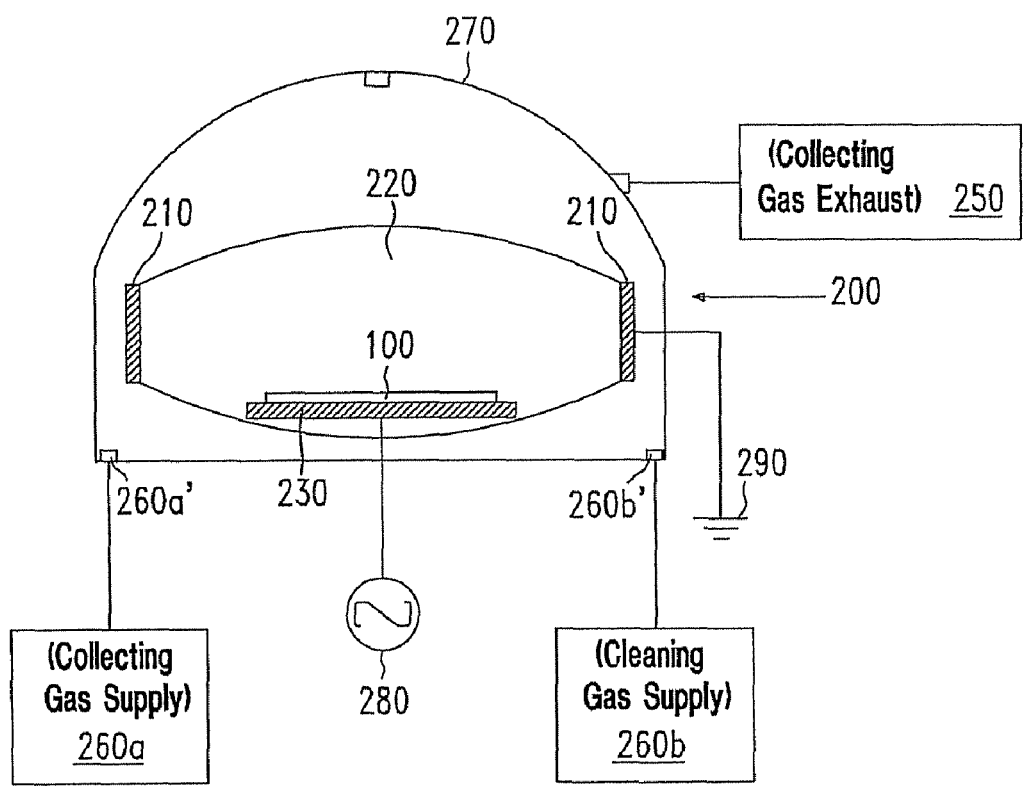
FIG. 2 illustrates a schematic view of a chamber structure used for processing the semiconductor structure of FIG. 1, in accordance with embodiments of the present invention.

FIG. 2 illustrates a schematic view of a chamber structure 200 used for processing the semiconductor structure 100 of FIG. 1, in accordance with embodiment of the present invention. More specifically, in one embodiment, the chamber structure 200 comprises a grounding shield 210, a pedestal 230, a collecting gas exhaust 250, a collecting gas supply 260a, a collecting gas inlet 260a', a cleaning gas supply 260b, a cleaning gas inlet 260b', a chamber wall 270, a radio frequency source 280, and a ground connector 290.

In one embodiment, the cleaning process of the semiconductor structure 100 in the chamber structure 200 is as follows. Illustratively, the cleaning process starts with the placing of the semiconductor structure 100 on top of the pedestal 230 in the chamber structure 200 as shown.

Next, in one embodiment, the grounding shield 210 is electrically grounded, and the pedestal 230 is electrically connected to the radio frequency source 280. As a result, the pedestal 230 is negatively charged resulting in the grounding shield 210 being more electrically positive than the pedestal 230. Therefore, the pedestal 230 becomes a cathode 230 whereas the grounding shield 210 becomes an anode 210. As a result, an electric field is formed between the cathode 230 and the anode 210.

Next, in one embodiment, a cleaning gas is injected from the cleaning gas supply 260b into the chamber structure 200 via the cleaning gas inlet 260b'. In one embodiment, the cleaning gas inlet 260b' is disposed in proximity to the wafer 110. In one embodiment, the cleaning gas comprises argon and HF. Under an electric field energy of the electric field formed between the cathode 230 (the pedestal 230) and the anode 210 (the grounding shield 210), argon molecules are ionized resulting in a plasma region 220. It should be noted that, the plasma region 220 includes places in the chamber structure 200 where the electric field energy is stronger than an argon-ionizing threshold.

It should be noted that the ionizing potential of Argon is about 15.8 eV. Also, the energy in the plasma region 220 can be higher than this value of 15.8 eV. This is because of the following two reasons. First, electron energy follows a Maxwell-Boltzmann distribution, resulting in some points in the plasma region 220 necessarily having energy higher than 15.8 eV. Second, Thermal exicitation can drive energies higher than 15.8 eV.

The ionization of the argon molecules provides electrons and argon ions for the plasma region 220. Under the electric field energy, the electrons travel toward the grounding shield 210 (the anode 210). Also under the electric field energy, the argon ions travel toward the pedestal 230 (the cathode 230) and bombard the native silicon oxide layers of the semiconductor structure 100.

It should be noted that, while the argon ions bombard and the HF chemically reacts with the native silicon oxide layers resulting in the native silicon oxide layers being removed, the argon ions also bombard and the HF also chemically reacts with the dielectric layer 130 of the semiconductor structure 100 resulting in by-product particles of the cleaning process.

It should be noted that, the by-product particles of the cleaning process are dispersed into inner space of the chamber structure 200. Some of the by-product particles adhere to the chamber wall 270 while some others of the by-product particles deposit back onto the semiconductor structure 100. The deposition back of the by-product particles to the semiconductor structure 100 is not good for the formation of the electrical contacting regions in the first and second contact holes 140a and 140b (with reference to FIG. 1). As a result, in one embodiment, a by-product collecting process is performed simultaneously with the cleaning process so as to prevent the deposition back of the by-products to the semiconductor structure 100 or to a next semiconductor structure (not shown) being subsequently processed in the chamber structure 200.

In a first embodiment, assume that the dielectric layer 130 comprises silicon dioxide ($SiO_2$). As a result, the by-product of the cleaning process comprises silicon dioxide. It should be noted that, silicon dioxide adheres well to the chamber wall 270. As a result, the by-product collecting process may be omitted in this case.

In a second embodiment, assume alternatively that the dielectric layer 130 comprises silicon nitride ($Si_xN_y$). As a result, a first by-product mixture comprising $N_2$, Si, and silicon nitride ($Si_xN_y$) is created by the cleaning process. In this case, in one embodiment, during the by-product collecting process, a first collecting gas is injected from the collecting gas supply 260a into the chamber structure 200 via the collecting gas inlet 260a'. In one embodiment, the collecting gas inlet 260a' is disposed in proximity to the chamber wall 270.

Illustratively, the first collecting gas comprises $N_2$ and $NF_3$. As a result, the first collecting gas serves as a catalyst to enhance the formation of $Si_3N_4$ from the first by-product mixture. It should be noted that $Si_3N_4$ adheres adequately to the chamber wall 270. As a result, this essentially prevents the first by-product mixture of the cleaning process from depositing back to the semiconductor structure 100 or to the next semiconductor structure being subsequently processed in the chamber structure 200.

In a third embodiment, assume alternatively that the dielectric layer 130 comprises a low-K carbon containing material or more generally a carbon containing dielectric material (such as polyimide). As a result, a second by-product mixture comprising carbon (C) and carbon containing materials is created by the cleaning process. In one embodiment, during the by-product collecting process, a second collecting gas from the collecting gas supply 260a is injected into the chamber structure 200 via the collecting gas inlet 260a'.

In one embodiment, the second collecting gas comprises ionized hydrogen. As a result, the ionized hydrogen chemically reacts with the carbon (C) and carbon containing materials to form hydrocarbon gases. One of the resulting hydrocarbon gases can be methane ($CH_4$).

In one embodiment, the resulting hydrocarbon gases formed by the by-product collecting process are pumped out of the chamber structure 200 via the collecting gas exhaust 250. As a result, this essentially prevents the second by-product mixture of the cleaning process from depositing back to the semiconductor structure 100 or to the next semiconductor structure being subsequently processed in the chamber structure 200.

It should be noted that the ionized hydrogen of the second collecting gas is positively charged. It should also be noted that the plasma region 220 comprises argon ions, which are positively charged. As a result, the ionized hydrogen tends to stay away from the plasma region 220.

In one embodiment, the first and second collecting gases are ionized before being injected into the chamber structure 200 via the collecting gas inlet 260a'. In one embodiment, the first and second collecting gases are injected into the chamber structure 200 but outside the plasma region 220.

In one embodiment, the semiconductor structure 100 can be a transistor and the cleaning process and the by-product collecting process can be performed before filling the first and second contact holes 140a and 140b with the two electrical contacting regions.

In summary, the cleaning process to remove the native silicon oxide layers may create the unwanted by-product particles that may deposit back to the semiconductor structure 100 or to the next semiconductor structure being subsequently processed in the chamber structure 200.

If the dielectric layer 130 comprises silicon nitride ($Si_xN_y$), then the cleaning process creates the first by-product mixture of $N_2$, Si, and silicon nitride ($Si_xN_y$). As a result, the first collecting gas comprising $N_2$ and $NF_3$ serves as the catalyst to enhance the formation of $Si_3N_4$, which adheres adequately to the chamber wall 270.

If the dielectric layer 130 comprises a low-K carbon containing material, then the cleaning process creates the second by-product mixture of carbon (C) and carbon containing materials. As a result, the second collecting gas comprising ionized hydrogen chemically reacts with the second by-product mixture to form hydrocarbon gases which can be simultaneously pumped out of the chamber structure 200.

In short, the by-product collecting process essentially prevents the by-product particles of the cleaning process from depositing back to the semiconductor structure 100 or to the next semiconductor structure being subsequently processed in the chamber structure 200.

In the embodiments described above, the cleaning gas and the collecting gas are introduced simultaneously into the chamber structure 200 via the cleaning gas supply 260b and the collecting gas supply 260a, respectively. Alternatively, the cleaning gas and the collecting gas can be introduced into the chamber structure 200 via a single gas inlet (not shown) alternatingly. That is a first amount of the cleaning gas is first introduced into the chamber structure 200 via the single gas inlet. Then, a second amount of the collecting gas is introduced into the chamber structure 200 via the single gas inlet. Then, a third amount of the cleaning gas is introduced into the chamber structure 200 via the single gas inlet, and so on.

In the embodiments described above, with reference to FIG. 1, the regions 120a and 120b comprise a silicide material (e.g., nickel silicide). Alternatively, the regions 120a and 120b can comprise copper, aluminum, or tungsten, etc.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A device fabrication process, comprising:
  providing an apparatus which includes:
  (a) a chamber bounded by an enclosure having a bottom surface, a top curved surface functioning as a lid of the chamber, and a side surface mechanically connecting the top surface to the bottom surface, wherein the chamber includes a first inlet and a second inlet,
  (b) an anode structure within the chamber and physically separated from the enclosure, wherein the anode structure comprises an anode surface,
  (c) a cathode structure within the chamber, wherein the cathode structure comprises a cathode surface, and
  (d) a wafer on the cathode structure such that a wafer surface of the wafer is on and in direct physical contact with the cathode surface, wherein the wafer is disposed between the cathode structure and the anode structure;
  injecting a cleaning gas into the chamber via the first inlet;
  injecting a collecting gas into the chamber via the second inlet;
  generating an electric field between the cathode surface and the anode surface, wherein the cathode surface is more negatively charged than the anode surface, wherein a first direction is perpendicular to the cathode surface and the wafer surface, and wherein the first direction is perpendicular to a surface normal direction at every spatial point on the anode surface; and
  ionizing the cleaning gas into a plasma comprising electrons and positive ions, wherein the positive ions are accelerated to the cathode surface by the electric field to etch a top surface of the wafer resulting in a by-product mixture in the chamber, wherein the collecting gas has a property of preventing the by-product mixture from depositing back to the surface of the wafer.

2. The process of claim 1, wherein the collecting gas comprises ionized hydrogen.

3. The process of claim 1, wherein said injecting the cleaning gas and said injecting the collecting gas into the chamber are performed simultaneously.

4. The process of claim 1, wherein the by-product mixture comprises $N_2$, Si, and silicon nitride ($Si_xN_y$).

5. The process of claim 4, wherein the collecting gas has a property of enhancing the formation of $Si_3N_4$ from the by-product mixture.

6. The process of claim 5, wherein the collecting gas comprises $N_2$ and $NF_3$.

7. The process of claim 1, wherein the by-product mixture comprises a carbon containing material.

8. The process of claim 7, wherein the collecting gas has a property of chemically reacting with the carbon containing material resulting in a gas product.

9. The process of claim 8, further comprising pumping the gas product out of the chamber.

10. The process of claim 8, wherein the collecting gas comprises ionized hydrogen.

11. The process of claim 1, further comprising:
  electrically grounding the anode structure; and
  electrically coupling the cathode structure to a radio frequency source resulting in the cathode surface being more negatively charged than the anode surface.

12. The process of claim 1, wherein said injecting the cleaning gas comprises flowing the cleaning gas from a cleaning gas supply into the chamber via the first inlet, wherein said injecting the collecting gas comprises flowing the collecting gas from a collecting gas supply into the chamber via the second inlet, wherein the first and second inlets are at different locations on a bottom surface of the chamber, and wherein the chamber includes an exhaust outlet in a top surface of the chamber for exhausting the collecting gas.

13. The process of claim 12, wherein a totality of inlets and outlets in the chamber consists of the first inlet, the second inlet, and the exhaust outlet.

14. The process of claim 1, wherein the wafer comprises a dielectric layer, wherein a constituent of the cleaning gas reacts with the dielectric layer to generate particles comprised by the by-product mixture.

15. The process of claim 14, wherein the cleaning gas comprises argon and HF, and wherein the constituent of the cleaning gas that reacts with the dielectric layer consists of said HF.

16. The process of claim 6, wherein the collecting gas consists of $N_2$ and $NF_3$.

* * * * *